United States Patent [19]

Bollard

[11] 4,254,495
[45] Mar. 3, 1981

[54] CONTROL SYSTEM INCLUDING BUILT IN TEST EQUIPMENT FOR WIRING HARNESS INTERFACE TESTING

[75] Inventor: Robert J. Bollard, Wayne, N.J.

[73] Assignee: The Bendix Corporation, Teterboro, N.J.

[21] Appl. No.: 52,499

[22] Filed: Jun. 27, 1979

Related U.S. Application Data

[63] Continuation-in-part of Ser. No. 873,311, Jan. 30, 1978, abandoned.

[51] Int. Cl.³ .......................................... H04M 1/24
[52] U.S. Cl. .............................. 370/14; 179/175.25; 179/175.3 A
[58] Field of Search .......................... 370/14, 13, 16; 179/175.25, 175.3 A, 175.3 C

[56] References Cited

U.S. PATENT DOCUMENTS

| | | | |
|---|---|---|---|
| 3,252,088 | 5/1966 | Palmer | 179/175.3 A |
| 3,401,238 | 9/1968 | Williams | 179/175.25 |
| 3,566,038 | 2/1971 | Slavin | 370/112 |
| 3,644,687 | 2/1972 | Richards | 179/175.3 A |

Primary Examiner—David L. Stewart
Attorney, Agent, or Firm—Anthony F. Cuoco; William F. Thornton

[57] ABSTRACT

A control system features built in test equipment for wiring harness interface testing, i.e., testing critical wires leading to the system from external signal sources, for reducing maintenance costs and for insuring critical wire validity of line replacement units.

8 Claims, 2 Drawing Figures

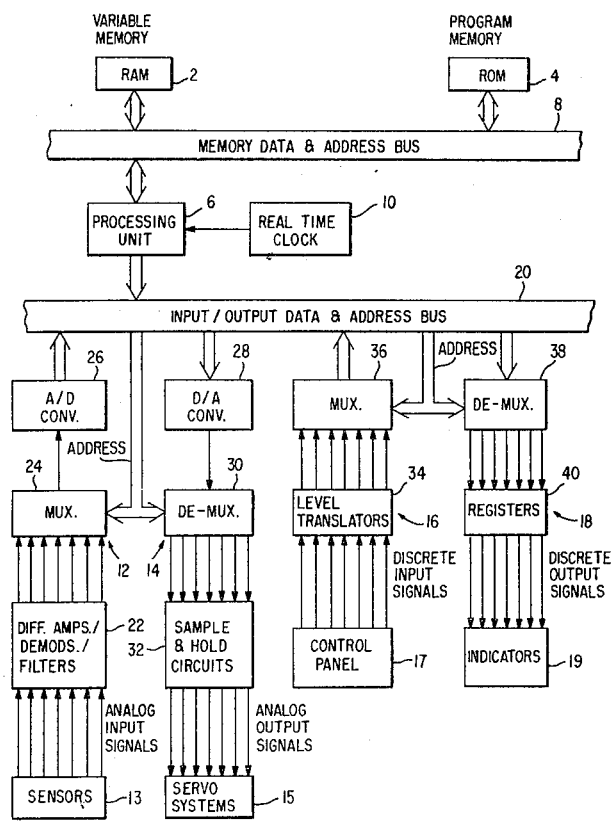

CONTROL SYSTEM INCLUDING BUILT IN TEST EQUIPMENT FOR WIRING HARNESS INTERFACE TESTING

CROSS REFERENCE TO RELATED APPLICATIONS

This application is a continuation-in-part of U.S. application Ser. No. 873,311, filed by Robert J. Bollard on Jan. 30, 1978, and now abandoned.

DESCRIPTION OF THE INVENTION

1. Field of the Invention

This invention relates to control systems and particularly to control systems of the type having a built in test equipment capability whereby the wiring interface from external signal sources to the system is easily and economically tested.

2. Prior Art

Control systems include controllers and analog and discrete input and output signal channels associated therewith. The control systems operate in response to signals from external signal sources which are frequently line replacement units (LRU's). When systems of this type are used for flight control purposes it becomes necessary to guard against faults on critical wires included in the wiring harness connecting the signal sources to the system. Additionally, it is desirable that the need for total wire separation be eliminated when retrofitting aircraft to reduce the retrofitting cost. Further, it is desirable to reduce maintenance costs by reduced on-ground wiring troubleshooting, and through integration with existing flight monitoring implementations. Still further, adequate means must be provided to insure critical wire validity after LRU replacement for reducing maintenance time and maintaining Federal Aviation Administration (FAA) certification and such other certification as may be required for the flight control system. Prior to the present invention the above noted functions could only be performed by extensive ground based testing which is costly and time consuming.

SUMMARY OF THE INVENTION

This invention contemplates a control system including built in wiring harness interface test equipment which utilizes a high frequency sine wave oscillator. The output of the oscillator is applied through a decoupling network which acts as a DC restorer circuit and provides a tracer signal having a known impedance. The decoupling network applies the tracer signal to a tracer injection multiplexer. The multiplexer is controlled by the system controller for providing a plurality of signals and for applying the signals to selected wires in the harness. A tracer detection multiplexer is controlled by the controller to verify first that a signal applied to a selected wire is present on that wire and then checks that the signal is not present on any other wire, and provides a verification signal which is applied to a frequency detector. The frequency detector is arranged so that its output is "false" (valid) when it detects a high frequency signal and "true" (invalid) when it does not. The system is thus fail safe. The output of the frequency detector is applied to the controller for controlling the control functions thereof. The invention as described may be used as part of ground verification built in test equipment (BITE), in flight as a pre-land test, or interfaced with in-flight monitoring systems.

One object of this invention is to provide a control system including for testing critical wires connecting external signal sources to the system.

Another object of this invention is to provide a system of the type described wherein critical wire validity after LRU replacement can be ascertained more economically than has heretofore been the case.

Another object of this invention is to provide a system for controlling an aircraft and to integrate the testing means of the invention with in-flight monitoring apparatus to reduce maintenance costs.

Another object of this invention is to provide means of the type described which may be used as part of a ground verification built in test system, in-flight as a pre-land test procedure or interfaced with in-flight monitoring systems. Another object of this invention is to apply signals and to test the validity of the applied signals.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

DRAWINGS

DETAILED DESCRIPTION OF THE INVENTION

Figure 1:
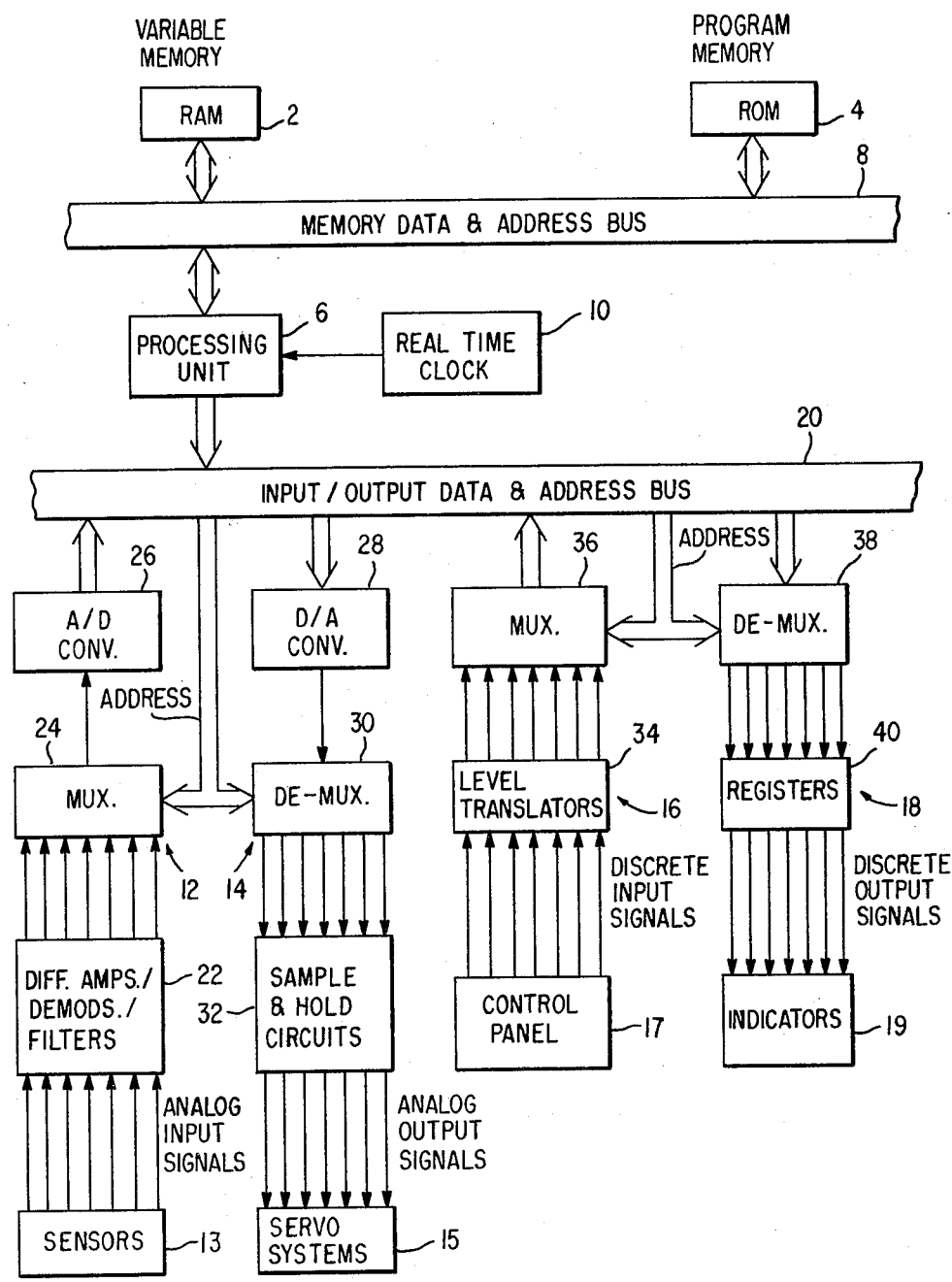
FIG. 1 is a block diagram showing, for purposes of illustration, a digital control system of the type which may utilize the wiring harness interface testing system of the invention.

For purposes of describing the invention a digital control system will be described, although the invention is applicable to an analog system as well, as will be understood by those skilled in the art. A typical digital control system is shown as including a random access memory device (RAM) 2 and a read only memory device (ROM) 4. RAM 2 applies a variable memory and ROM 4 applies a program memory to a processing unit 6 (controller) through a memory data and address bus 8. A real time clock 10 provides a signal which is applied to processing unit 6 for determining the rate of computation sampling in the digital control system.

An analog input signal channel designated generally by the numeral 12, an analog output signal channel designated generally by the numeral 14, a discrete input signal channel designated generally by the numeral 16 and a discrete output signal channel designated generally by the number 18 are connected to processing unit 6 through an input/output data and address bus 20.

Analog input signal channel 12 receives a plurality of analog input signals from signal sources such as sensors 13 which may be, for purposes of illustration, gyros or other flight condition sensors included in a digital flight control system. The analog signals are applied to corresponding differential amplifiers/demodulators/filters designated generally by the numeral 22 and applied therefrom to a multiplexer 24. Multiplexer 24 provides a signal which is applied to an analog to digital converter 26 and therefrom to processing unit 6 through input-/output data and address bus 20.

Analog output signal channel 14 includes a digital to analog converter 28 connected to processing unit 6 through bus 20 for providing an analog signal which is applied to a demultiplexer 30. Demultiplexer 30 provides a plurality of signals which are applied to corresponding sample and hold circuits designated generally by the numeral 32 for providing a plurality of analog output signals. The analog output signals are applied, for purposes of illustration, to servo systems or the like designated generally by the numeral 15 for displacing the control surfaces of an aircraft.

Discrete input signal channel 16 receives a plurality of discrete input signals which may be generated by an operator-operated system control panel 17. For purposes of illustration, these signals may be validity signals, i.e., logic "high" or logic "low", corresponding to the analog signals provided by sensors 13. The discrete input signals are applied to corresponding level translators designated generally by the numeral 34 and therefrom to a multiplexer 36 connected to processing unit 6 through input/output data and address bus 20.

Discrete output channel 18 includes a demultiplexer 38 connected to processing unit 6 through bus 20. Demultiplexer 38 provides a plurality of signals which are applied to corresponding registers designated generally by the numeral 40 for providing a corresponding plurality of discrete output signals which drive indicators or the like designated generally by the numeral 19 for indicating the validity or invalidity of the analog input signals, as the case may be.

As heretofore noted, the digital control system described with reference to FIG. 1, is of the type known in the art such as used for flight control purposes, and only as much of the system as is necessary to describe the present invention has been illustrated and described.

Figure 2:
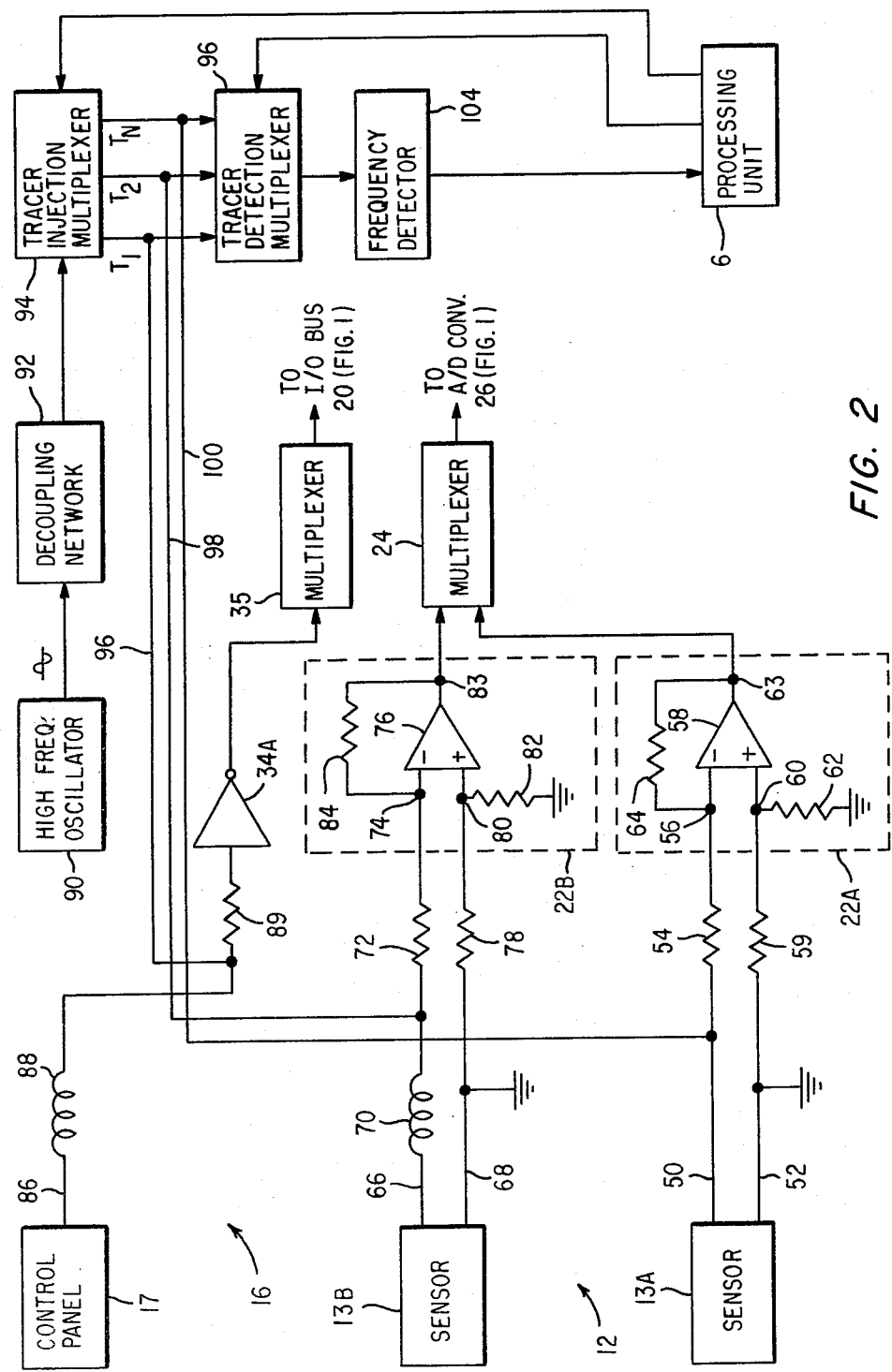
FIG. 2 is a block diagram-electrical schematic showing the harness interface testing system of the invention in conjunction with a digital control system such as illustrated in FIG. 1.

With reference to FIG. 2, which illustrates the wiring harness interface testing implementation of the invention, analog input signal channel 12 and discrete input channel 16 are shown. For purposes of illustration, channel 12 is shown as including two sensors 13A and 13B, each providing corresponding system input signals, and channel 16 as including control panel 17 providing a single system input signal, and which input signals are directed through the configuration of the invention. It will be understood that other like input signals may be directed through like configurations to accomplish the purposes of the invention.

Thus, particular sensor 13A of sensors 13 (FIG. 1) provides a pair of analog input signals at conductors 50 and 52 which may represent "high" and "low" signal levels, respectively. Conductor 50 is connected through a resistor 54 to an inverting input terminal 56 of a differential amplifier 58, while conductor 52 is grounded and is connected through a resistor 59 to a non-inverting input terminal 60 of differential amplifier 58. Non-inverting input terminal 60 is grounded through a resistor 62. An output terminal 63 of differential amplifier 58 is connected to the inverting input terminal 56 thereof through a resistor 64. Differential amplifier 58 and its associated resistors are included in a particular differential amplifier/demodulator/filter 22A of differential amplifiers/demodulators/filters 22 (FIG. 1).

Particular sensor 13B of sensors 13 (FIG. 1) provides a pair of analog input signals at conductors 66 and 68 which may represent "high" and "low" signal levels, respectively. Conductor 66 is connected through a choke 70 and a resistor 72 to an inverting input terminal 74 of a differential amplifier 76, while conductor 68 is grounded and is connected through a resistor 78 to a non-inverting input terminal 80 of amplifier 76. Non-inverting input terminal 80 is grounded through a resistor 82. An output terminal 83 of differential amplifier 76 is connected through a resistor 84 to inverting input terminal 74 of amplifier 76. Amplifier 76 and its associated resistors are included in a particular differential amplifier/demodulator/filter 22B of differential amplifiers/demodulators/filters 22 (FIG. 1).

For purposes of illustration, control panel 17 is shown as providing a single discrete input signal at a conductor 86. Conductor 86 is connected through a choke 88 and a resistor 89 to a particular level translator 34A of level translators 34 (FIG. 1).

In connection with chokes 70 and 88, it will be understood that the signals from sensor 13B and control panel 17 may be low impedance signals and the chokes provide a known impedance to the signals for proper operation of the system as will hereinafter become evident.

Conductors 50, 52, 66, 68 and 86 are included in a wiring harness connecting sensors 13A and 13B and control panel 17 to the control system as is well known in the art.

The outputs of differential amplifier/demodulator filter 22A and 22B are applied to multiplexer 24 and therefrom to analog to digital converter 26 as shown in FIG. 1. The output of level translator 34A is applied to multiplexer 36 and therefrom to I/O bus 26 as also shown in FIG. 1.

A high frequency oscillator 90 provides a sine wave output which is applied to a decoupling network 92. Decoupling network 92 provides a tracer signal having a predetermined impedance.

The tracer signal is applied to a tracer injection multiplexer 94 which provides a plurality of signals designated as $T_1$, $T_2$, and $T_N$ and is controlled by processing unit 6 to apply these signals to appropriate wires connecting sensors 13A, 13B and control panel 17 to the digital control system.

Thus, signal $T_1$ is applied to conductor 86 leading from control panel 17, intermediate choke 88 and resistor 89 via conductor 96. Signal $T_2$ is applied to conductor 66 leading from sensor 13B, intermediate choke 70 and resistor 72 via conductor 98 and signal $T_N$ is applied to conductor 50 leading from sensor 13A intermediate the sensor output and resistor 54 via conductor 100.

Signals $T_1$, $T_2$, and $T_N$ from tracer injection multiplexer 94 are applied to a tracer detection multiplexer 95 which is controlled by processing unit 6 to first verify that the injection signals from tracer injection multiplexer 94 appear on the correct wire 86, 66 or 50, as the case may be, and then verifies that the signal is not on any other wire. Tracer detection multiplexer 95 provides a verification signal which is applied to a frequency detection circuit 104. The arrangement is such that the output of frequency detection circuit 104 is "false" when a high frequency signal is detected and "true" when said high frequency signal is not detected. The system is hence fail safe. The output of frequency detector 104 is applied to processing unit 6 to control the processing unit for applying the controlling signals therefrom to multiplexers 94 and 95.

Operation of the Invention

Processing unit 6 controls tracer injection multiplexer 94 to apply the tracer signal from decoupling network 92 and having a known impedance as aforenoted to the system via signal $T_1$ applied over conductor 96 to input wire 86. The system forms a voltage divider circuit between the output of the decoupling network and the external sensor impedance. Thus, signal $T_1$ represents the voltage drop across the sensor impedance.

Processing unit 6 controls tracer detection multiplexer 95 to interrogate signal $T_1$ for a predetermined amplitude and frequency while it is still connected to input wire 86. The frequency of signal $T_1$ corresponds to the frequency of the signal from oscillator 90 and the amplitude of the signal is a function of the known output impedance from decoupling network 92 and the system impedance provided as by choke 88 and the external sensor which, in the case described, is control panel 17.

If signal $T_1$ has the predetermined amplitude and frequency, the multiplexed verification signal (derived from signal $T_1$) from tracer detection multiplexer 95 causes the output from frequency detector 104 to be zero (valid).

If there is a short between any two input wires, the system impedance will be reduced to that of the parallel combination of the two shorted wires. This will cause a reduction in amplitude of the tracer signal and a corresponding reduction in amplitude of signal $T_1$ at the input to tracer detection multiplexer 95. Again, since the input signal to the tracer detection multiplexer is not at the predetermined amplitude, the verification signal at the output of the frequency detector will be "true" (invalid).

It will thus be seen that with the arrangement described signals are applied and the validity of the applied signals is tested.

Processing unit 6 controls tracer detection multiplexer 95 to interrogate all of the other tracer detection multiplexer input signals $T_2-T_N$, one at a time, to insure that the signal amplitude and frequency still being injected on signal $T_1$ is not present on the other input wires.

The processing unit next controls tracer injection multiplexer 94 to apply the tracer signal from decoupling network 92 to the system via signal $T_2$ applied over conductor 98 and input wire 66, to repeat the aforenoted test steps. The process is repeated through signal $T_N$ to complete the test sequence.

In regard to processing unit 6 controlling tracer injection multiplexer 94 and tracer detection multiplexer 95, once the frequency and the amplitude of the signals from multiplexer 94 are known as heretofore described, the processing unit may be programmed as is well known in the programming art to provide the described control functions.

It will now be seen from the aforegoing description of the invention with reference to the drawings that the heretofore noted objects have been met. A control system is provided which includes wiring harness interface testing means for testing critical wires connecting external signal sources to the system. The testing means facilitates retrofitting and critical wire validation after LRU replacement. The test system may be integrated with other monitoring apparatus to reduce maintenance costs and enhances LRU replacement as is desirable for maintaining certification of the flight control system.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A control system of the type responsive to a plurality of signals from external signal sources for providing a control function, comprising:

wiring harness means including a plurality of wires for applying the plurality of signals to the control system;

a controller;

means for providing a tracer signal;

first means connected to the tracer signal means and responsive to the tracer signal therefrom for providing a plurality of signals, and connected to the controller and controlled thereby for applying one of the plurality of signals to a predetermined wire of the plurality of wires in the wiring harness means;

second means connected to the means for providing a plurality of signals for receiving said signals, and connected to the controller and controlled thereby for verifying that the one of the plurality of signals is applied only to the predetermined wire and for providing a verification signal; and third means connected to the second means for detecting the frequency of the verification signal and for providing a corresponding output signal.

2. A control system as described by claim 1, wherein the means for providing a tracer signal includes:

means for providing a high frequency oscillating signal; and means responsive to the high frequency oscillating signal for providing the tracer signal having a predetermined impedance.

3. A control system as described by claim 1, wherein:

the controller provides first and second control signals;

the first means is controlled by the first signal for applying one of the plurality of signals to a predetermined wire of the plurality of wires in the wiring harness means; and the second means is controlled by the second signal for verifying that the one of the plurality of signals is applied only to the predetermined wire.

4. A control system as described by claim 1, wherein:

the third means connected to the second means for detecting the frequency of the verification signal and for providing a corresponding output signal provides an output signal in a "false" state when the verification signal is of a high frequency and an output signal in a "true" state when the verification signal is not of a high frequency.

5. A control system as described by claim 1, wherein:

the third means which is connected to the second means for detecting the frequency of the verification signal and for providing a corresponding output signal is connected to the controller; and the controller is controlled in response to the output signal from the third means for controlling the first and second means.

6. A control system, comprising:

controller means providing first and second control signals;

a plurality of connecting means, each of which connects a corresponding signal source to the system for applying the input signals thereto;

means for providing an oscillating signal;

means connected to the oscillating signal means and responsive to the oscillating signal therefrom for providing a tracer signal;

first means connected to the tracer signal means and responsive to the tracer signal therefrom for providing a plurality of signals, and connected to the controller and controlled by the first control signal therefrom for applying one of the plurality of signals to a predetermined connecting means;

second means connected to the first means for receiving the plurality of signals, and connected to the controller and controlled by the second control signal therefrom for verifying that the one of the plurality of signals is applied to the predetermined connecting means and is not applied to any of the other connecting means, and for providing a verification signal;

detecting means connected to the second means for detecting the frequency of the verification signal and providing an output signal in accordance with the detected frequency; and the controller means connected to the detector and responsive to the output signal therefrom for providing the first and second control signals.

7. A control system of the type responsive to a plurality of signals from external signal sources for providing a control function, comprising;

wiring harness means including a plurality of wires for applying the plurality of signals to the control system;

a controller providing first and second controlling signals;

means for providing a tracer signal;

first means connected to the tracer signal means and responsive to the tracer signal therefrom for providing a plurality of signals, and connected to the controller and controlled by the first controlling signal for applying one of the plurality of signals to a predetermined wire of the plurality of wires in the wiring harness means;

second means connected to the means for providing a plurality of signals for receiving said signals, and connected to the controller and controlled by the second controlling signal for verifying that the one of the plurality of signals is applied only to the predetermined wire and for providing a verification signal; and means connected to the second means for detecting the frequency of the verification signal and for providing a corresponding output signal.

8. A control system as described by claim 7, wherein:

the means connected to the second means for detecting the frequency of the verification signal and for providing a corresponding output signal is connected to the controller; and the controller is controlled in response to the output signal for providing the first and second controlling signals.

\* \* \* \* \*